(12) United States Patent
Busi et al.

(10) Patent No.: US 10,622,090 B2
(45) Date of Patent: *Apr. 14, 2020

(54) ARBITRATION FOR MEMORY DIAGNOSTICS

(71) Applicant: INTERNATIONAL BUSINESS MACHINES CORPORATION, Armonk, NY (US)

(72) Inventors: Aravindan J. Busi, Bangalore (IN); Kevin W. Gorman, Fairfax, VT (US); Deepak I. Hanagandi, Bagalkot (IN); Kiran K. Narayan, New Delhi (IN); Michael R. Ouellette, Westford, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/145,678

(22) Filed: Sep. 28, 2018

(65) Prior Publication Data

US 2019/0035486 A1  Jan. 31, 2019

Related U.S. Application Data

(63) Continuation of application No. 14/669,056, filed on Mar. 26, 2015, now Pat. No. 10,153,055.

(51) Int. Cl.
| | | |
|---|---|---|
| G11C 29/56 | (2006.01) | |
| G11C 29/12 | (2006.01) | |
| G01R 31/3187 | (2006.01) | |
| G11C 29/44 | (2006.01) | |
| G11C 29/04 | (2006.01) | |
| G11C 29/26 | (2006.01) | |

(52) U.S. Cl.
CPC .... *G11C 29/56008* (2013.01); *G01R 31/3187* (2013.01); *G11C 29/12* (2013.01); *G11C 29/44* (2013.01); *G11C 29/4401* (2013.01); *G11C 2029/0401* (2013.01); *G11C 2029/2602* (2013.01); *G11C 2029/5602* (2013.01); *G11C 2029/5606* (2013.01)

(58) Field of Classification Search
CPC ............ G11C 29/56008; G11C 29/12; G11C 2029/0401; G11C 29/4401; G11C 29/44; G11C 2029/5602; G11C 2029/2602; G11C 2029/5606; G01R 31/3187
USPC ........................................ 714/718, 723, 733
See application file for complete search history.

(56) References Cited

U.S. PATENT DOCUMENTS

| | | |
|---|---|---|
| 5,408,628 A | 4/1995 | Ameti |
| 6,360,342 B1 | 3/2002 | Lee et al. |

(Continued)

OTHER PUBLICATIONS

List of IBM Patents or Patent Applications Treated as Related, 1 page.

*Primary Examiner* — James C Kerveros
(74) *Attorney, Agent, or Firm* — Alvin Borromeo; Andrew M. Calderon; Roberts Mlotkowski Safran Cole & Calderson, P.C.

(57) ABSTRACT

A serial arbitration for memory diagnostics and methods thereof are provided. The method includes running a built-in-self-test (BIST) on a plurality of memories in parallel. The method further includes, upon detecting a failing memory of the plurality of memories, triggering arbitration logic to shift data of the failing memory to a chip pad.

20 Claims, 6 Drawing Sheets

(56) References Cited

U.S. PATENT DOCUMENTS

| | | |
|---|---|---|
| 6,656,751 B2 | 12/2003 | Andersen et al. |
| 6,668,347 B1 | 12/2003 | Babella et al. |
| 7,036,064 B1 | 4/2006 | Kebichi et al. |
| 7,168,005 B2 | 1/2007 | Adams et al. |
| 7,171,592 B2 | 1/2007 | Togashi et al. |
| 7,200,786 B2 | 4/2007 | Cheng et al. |
| 7,206,979 B1 | 4/2007 | Zarrineh et al. |
| 7,206,984 B2 | 4/2007 | Anzou |
| 7,237,165 B2 | 6/2007 | Chadwick et al. |
| 7,254,763 B2 | 8/2007 | Aadsen et al. |
| 7,313,739 B2 | 12/2007 | Menon et al. |
| 7,444,564 B2 | 10/2008 | Anand et al. |
| 7,458,000 B2 | 11/2008 | Gorman et al. |
| 7,484,138 B2 | 1/2009 | Hsieh et al. |
| 7,627,792 B2 | 12/2009 | Ronza et al. |
| 7,644,323 B2 | 1/2010 | Wu et al. |
| 7,653,854 B2 | 1/2010 | Anzou et al. |
| 7,681,096 B2 | 3/2010 | Sasaki et al. |
| 7,757,135 B2 | 7/2010 | Nadeau-Dostie et al. |
| 8,032,803 B2 | 10/2011 | Anzou et al. |
| 8,176,372 B2 | 5/2012 | Anzou et al. |
| 8,392,777 B2 | 3/2013 | Chen et al. |
| 8,612,813 B2 | 12/2013 | Chickanosky et al. |
| 2005/0278595 A1 | 12/2005 | Anzou |
| 2006/0156133 A1* | 7/2006 | Mukherjee ........ G01R 31/31724 714/733 |
| 2008/0077831 A1 | 3/2008 | Sasaki et al. |
| 2008/0077835 A1* | 3/2008 | Khoche ............ G01R 31/31724 714/733 |
| 2010/0125766 A1 | 5/2010 | Anzou et al. |
| 2014/0189450 A1 | 7/2014 | Varadarajan et al. |
| 2015/0162097 A1* | 6/2015 | Eckert ................ G01R 31/3187 714/718 |
| 2016/0025808 A1* | 1/2016 | Singh ................ G01R 31/3177 714/733 |
| 2016/0284426 A1 | 9/2016 | Busi et al. |

* cited by examiner

ARBITRATION FOR MEMORY DIAGNOSTICS

FIELD OF THE INVENTION

The invention relates to diagnostic testing of memory and, more particularly, to serial arbitration for memory diagnostics and methods for automatic diagnostics.

BACKGROUND

Memory BIST (built-in-self-test) is an important tool for testing memories (including finding/diagnosing and repairing defects within those memories). As more memory is integrated into chips, thorough BIST test and repair is a requirement in order to ensure reasonable product quality/reliability levels. Also, as the amount of memories per chip increases with each advancing technology node, the density of the memories also increase which in-turn raises the probability of detecting more fails. Due to the large amount of memory present in each chip, the number of fails detected is also significant.

Diagnostics is a process of extracting information about the failing address locations and failure scenarios. By analyzing this data, it is possible to understand the memory failure modes and improve the BIST patterns. This helps a designer to select the patterns more efficiently. All these efforts help improve the yields in each technology node.

The diagnostics process currently employed shifts the fail information serially to the tester. This process needs to be repeated for each fail and for every memory on the chip. During the diagnostics collection process, all other BIST engines will be idle. This tends to be a tedious process and takes up a lot of tester time which is expensive. Hence, speeding up the diagnostics process improves the throughput of the tester significantly.

More specifically, the BIST is usually run in 2 modes. The first mode is used to observe the fails and the second mode is used to shift out the observed fails on the DIAG pin. While running in the second mode, the BIST pauses at the observed FAIL address and shifts the data for 'n' clock cycles, which depends on the length of the diagnostics chain. Once the shift is complete, BIST resumes with normal operation until the next FAIL is detected. The bottleneck in the above method is that it tends to be a manual process. As it is necessary to observe the fails in the first pass, the user needs to program the BIST to select the failing memory and configure the BIST in pause mode and then correctly shift for 'n' cycles based on the memory configuration where the FAIL is detected.

SUMMARY

In an aspect of the invention, a method comprises running a built-in-self-test (BIST) on a plurality of memories in parallel. The method further comprises, upon detecting a failing memory of the plurality of memories, triggering arbitration logic to shift data of the failing memory to a chip pad.

In an aspect of the invention, a method comprises determining diagnosis data of a failing memory of a plurality of memories is available from a selected BIST engine associated with the failing memory. The method further comprises determining that no downstream BIST engines are shifting diagnosis data of another failing memory. The method further comprises determining that a BIST controller is ready to accept the diagnosis data of the failing memory from the selected BIST engine. The method further comprises shifting the diagnosis data of the detected fail from the selected BIST engine, while keeping a diagnosis request signal asserted so that no other BIST engines shift diagnosis data. The method further comprises determining that all shifting is completed.

In an aspect of the invention, an arbitration architecture comprises: a BIST controller for receiving diagnosis data of a failed memory; a plurality of BIST engines connected to the BIST controller with a pin interface in a serial/daisy chain topology; and arbitration logic to serially order which of the plurality of BIST engines shifts diagnosis data of the failed memory to the BIST controller.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to diagnostic testing of memory and, more particularly, to serial arbitration for memory diagnostics and methods thereof. More specifically, in embodiments, the serial arbitration for memory diagnostics and methods thereof include arbitration logic for shifting data from multiple BIST engines to a BIST controller. In embodiments, the architecture/logic includes a BIST controller in combination with multiple BIST engines configured to arbitrate among failing memories in case of multiple fails. Advantageously, this arbitration logic saves a significant amount of test time and test pattern development/customization and enables faster diagnostics of the memory.

In more specific embodiments, the arbitration logic and architecture automatically logs fail data from a dynamically selected failing memory. In aspects of the invention, the architecture (e.g., Memory Built-In Self-Test (MBIST) architecture) includes a BIST controller (BISTCNTL) and multiple BIST engines running on all memories in parallel. Upon detection of a failing memory, the arbitration architecture/logic pauses test operation for all memories and, during the pause, the failing memory will trigger arbitration logic to dynamically select a logic observation path from the failing memory to a chip pad. A tester can then collect failing memory instance, failing data and failing address information from the arbitration architecture/logic, via the chip pad, for dynamically selected failing memory.

In the case of concurrent fails from multiple memories, the arbitration architecture/logic will control selection of the failing memories in a serial order, in a manner consistent with position of the memory and associated logic within the arbitration architecture such that all failing memory data from all concurrent failing memories is collected by the tester. The arbitration logic will start MBIST operation upon completion of collection of all failing memory data. In embodiments, the MBIST operation continues from the pause state, alleviating the need for the MBIST operation to start from the beginning.

In further embodiments, BISTCNTL/CLKCNTL need not be aware of the DIAG chain length of the memories. In addition, all relevant information about enumeration, BIST Type, DIAG length, etc. will be self-contained in the DIAG_data (diagnosis data) provided by each of the BIST engines to the BISTCNTL.

Advantageously, by implementing the arbitration architecture and logic (and methods) described herein extensive tester time can be saved. For example, (i) there is no need for the tester to run BIST multiple times for a fail collection;

(ii) fails from multiple BIST engines can be collected during a run;

(iii) all fails on all memories can be collected automatically during PF run, itself. PF refers to Pass/Fail flow mode of the BIST engine. This mode is essentially invoked to determine if the memory in question passes/fails the memory test operation.

Figure 1:
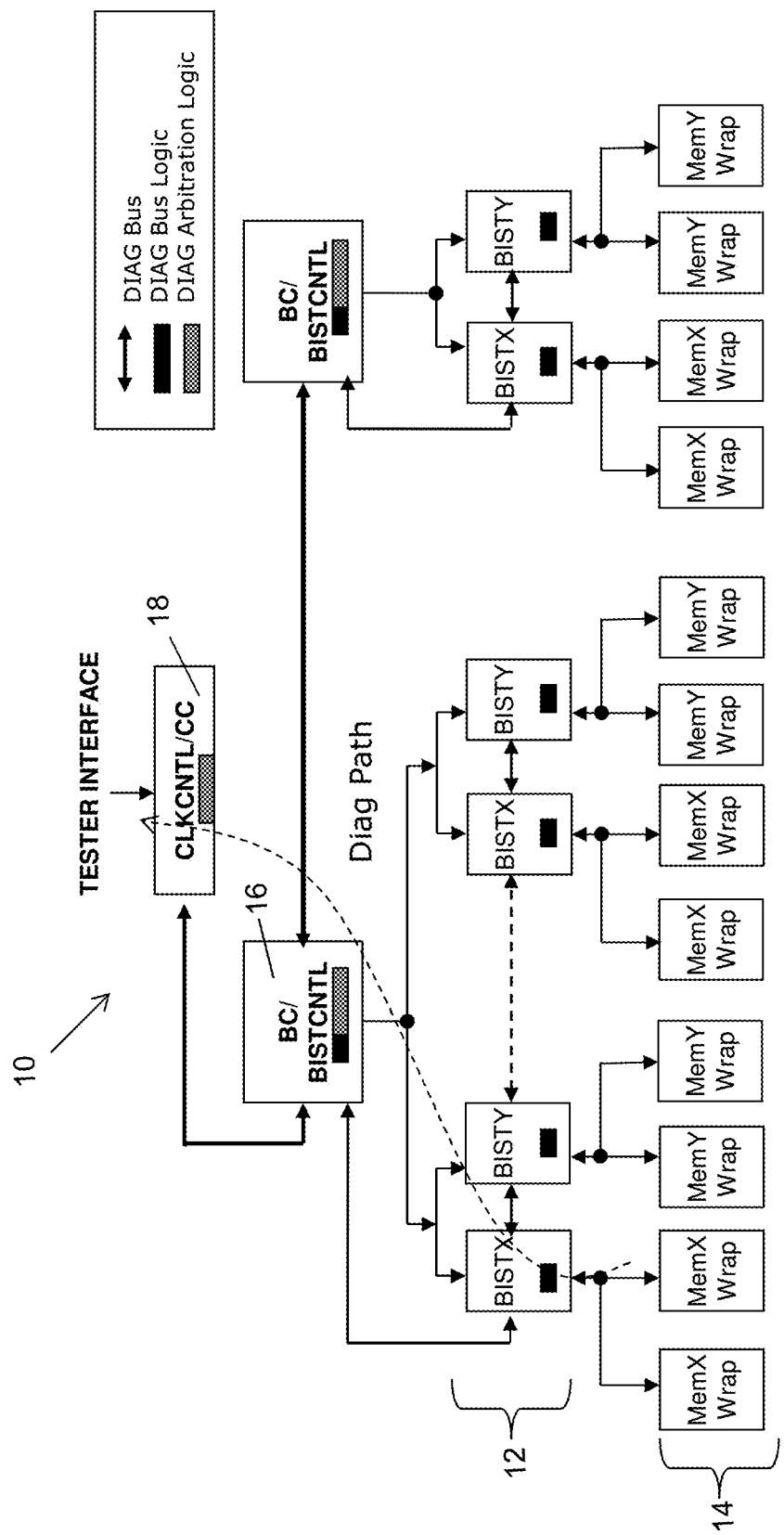
FIG. 1 shows an MBIST architecture/logic in accordance with aspects of the present invention.

FIG. 1 shows a MBIST architecture (logic) for identifying failing memory in accordance with aspects of the present invention. In embodiments, the MBIST architecture 10 includes a plurality of built-in self-test (BIST) engines 12 (e.g., BISTX, BISTY) which run in parallel on a plurality of different memory types 14 such as SRAM, RF, TCAM, etc. (designated by MemX Wrap, MemY Wrap). In embodiments, the BIST engines 12 are set up in a chained configuration and are configured to read from and write to specific types of memories. As should be understood by those of skill in the art, the BIST engines 12 will read from and write to the different memories 14 and compare the data to what is expected in order to determine failed information, e.g., bit patterns, bit positions, stuck bits (e.g., "0" or "1"), failing memory instance, failing data, failing address information, etc. This allows the tester to debug the memories and optimize pattern suite for future updates.

Still referring to FIG. 1, the BIST engines 12 are connected to the BIST controller (BISTCNTL) 16 with a three or four pin interface in a serial/daisy chain topology as described herein. By using the serial/daisy chain topology, the BIST engines 12 can provide failed information to the BIST controller (BISTCNTL) 16 in a certain order which, in turn, shifts the failed information to a tester interface 18. Finite-state machine (FSM) logic in the BIST engines 12 and BISCNTL 16 control the DIAG interface to the upstream arbiter, e.g., tester interface 18. Also, the FSM logic in the BISTCNTL 16 controls arbitration of the requests, e.g., which requests will be processed from particular BIST engines 12 in a particular order. The tester executes all BIST engines on the chip and waits for fails to be detected.

In operation, arbitrations will be based on the time of request and the position of the requestor (BIST engine 12) in the chain of BIST engines 12, where a first-to-request will be served first. Also, in embodiments, the BIST engines 12 closer to the BISTCNTL 16 will have higher priority in the arbitration scheme. By way of more specific example, upon detection of a fail (of a certain memory) by a particular BIST engine 12, the diagnosis control block checks if the DIAG bus is busy. If not, the BIST engine 12 will assert a diagnostic shift request signal (DIAG_SHreq) to the BISTCNTL 16. The requesting BIST engine 12 will wait for a diagnosis start (DIAG_start) signal from the BISTCNTL 16, at which time it will then send diagnostic data (DIAG_Data) (e.g., failed information) to the BISTCNTL 16. In embodiments, the DIAG data shift starts when DIAG_start goes high. The diagnostics data can then be shifted through the BISTCNTL 16 to the tester interface 18. DIAG_SHreq is de-asserted at the end of the shift. Once DIAG_start is de-asserted, the DIAG bus is released for use by other BIST engines downstream. In this way, the BIST engines 12 and BISTCNTL 16 contain the necessary logic to initiate and perform the diagnostic shift for different memory configurations.

Figure 2:
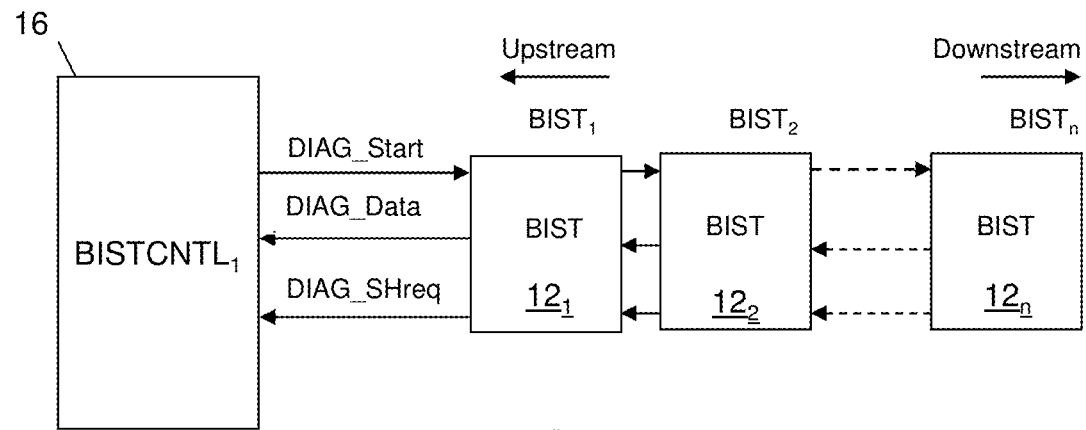
FIG. 2 shows an exemplary BIST controller and corresponding BIST engines with a three pin interface in accordance with aspects of the invention.

FIG. 2 shows a diagnostic bus of a BIST controller and corresponding BIST engines in accordance with aspects of the invention. In this embodiment, a programmable bit can be implemented in the BIST engines to enable/disable automatic shifting of DIAG_data. This will be useful for targeting specific memories for fail collection.

More specifically, in the architecture of FIG. 2, three busses (three pin interface) are provided in a daisy chain configuration between the BIST controller (BISTCNTL) 16 and a plurality of BIST engines $12_1$, $12_2$ . . . $12_n$. In embodiments, the signals provided on the busses include: DIAG_SHreq, DIAG_Data and DIAG_Start. In specific embodiments, DIAG_SHreq acts as both a DIAG shift request for each BIST engine $12_1$, $12_2$ . . . $12_n$ and a shift enable of DIAG_data. The DIAG_SHreq is driven by a DIAG shift requestor (e.g., diagnosis control block of a BIST engine) and buffered by the preceding and selected BIST engines $12_1$, $12_2$ . . . $12_n$ in the path, terminating at the BISTCNTL 16. The DIAG_Data shifts the DIAG_data and is driven by the BIST engines $12_1$, $12_2$ . . . $12_n$, which are shifting data, buffered by the remaining (e.g., preceding and selected) BIST engines $12_1$, $12_2$ . . . $12_n$ in the path. The DIAG_Start provides a DIAG shift approval from the BISTCNTL 16 (arbitrator). The DIAG_Start is driven by the BISTCNTL 16 and is buffered by the BIST engines $12_1$, $12_2$ . . . $12_n$ which have not requested shift and terminated at the DIAG shift requestor.

By way of a further illustrative example, upon detection of a fail by BIST engine $12_2$, the BIST engine $12_2$ will assert a DIAG_SHreq to the BISTCNTL 16. If there are no other fails detected by any farther (downstream) BIST engines, e.g., $12_n$, the DIAG_SHreq will be buffered to the BISTCNTL 16. The DIAG_SHreq can be buffered in the BIST engine $12_1$ (e.g., DIAG_SHreq remains asserted), while the BISTCNTL 16 asserts a DIAG-Start signal to the BIST engine $12_2$. Upon assertion of the DIAG_Start signal, the BIST engine $12_2$ will start shifting DIAG_data to the BISTCNTL 16. Once the data is shifted to the BISTCNTL 16, the DIAG_SHreq and DIAG_start should be de-asserted before another request begins. Meanwhile, if another BIST engine $12_n$ detects a fail, this next fail can then be shifted to the BISTCNTL 16 in a similar fashion so long as no upstream BIST engines are shifting DIAG_data. That is, if no upstream BIST engines are shifting DIAG_data, a new request can be started in the manner described above.

Figure 3:
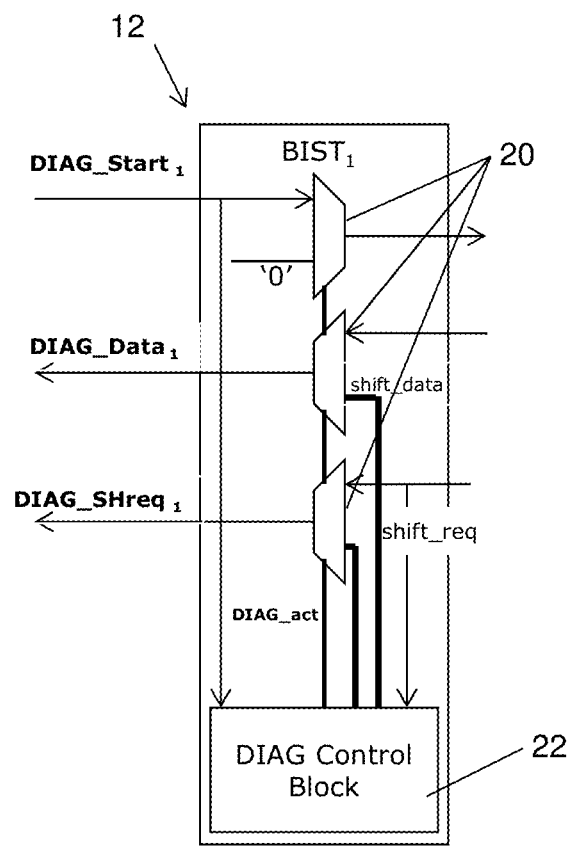
FIG. 3 shows an exemplary BIST engine logic for a three pin interface in accordance with aspects of the invention.

FIG. 3 shows a BIST engine in accordance with aspects of the invention. In this embodiment, the BIST engine 12 includes a DIAG Control Block (FSM) 22 which supports arbitration. For example, the DIAG Control Block 22 contains a state machine which decides when to request DIAG_Start. The structure of the DIAG Control Block 22 includes a plurality of MUXes 20. In embodiments, the MUXes 20 control the three DIAG_shift signals depending on the state of the BIST engine. For example, the DIAG_act enables/ disables DIAG bus control by the BIST and bypass when DIAG_act is de-asserted. More specifically, asserting "0" controls the MUXes so that it does not participate in the DIAG_shift process and all the signals are buffered to the next device in the chain; whereas, signal "1" will drive the "shift_req" and "shift_data" for a particular BIST engine. The signal "shift_req" is an internal DIAG_SHreq signal and is active when a fail is detected by the BIST engine and a shift request is initiated. The signal "shift_data" is an internal DIAG_Data signal which carries serial diagnostics data when a request is active and BISTCNTL asserts DIAG_Start.

In a more specific example, the DIAG Control Block 22 implements a state machine to initiate DIAG transfers to the tester. When a fail is seen in the BIST engine, the state machine checks the state of the daisy chain. This is done by probing the DIAG_SHreq signal. If the daisy chain is busy with a different DIAG transfer, the state machine waits until the bus is released (DIAG_SHreq de-asserted). When the bus is not in use, the state machine takes control of the chain by asserting DIAG_act. The FSM asserts Shift_req signal simultaneously and waits for the DIAG_start signal from the BISTCNTL. When DIAG_start is asserted by the BISTCNTL, the DIAG control block starts shift the DIAG data. At the end of the DIAG transfer, the DIAG_SHreq signal is de-asserted and the daisy chain is released from the state machine control for use by other BIST engines.

Figure 4:
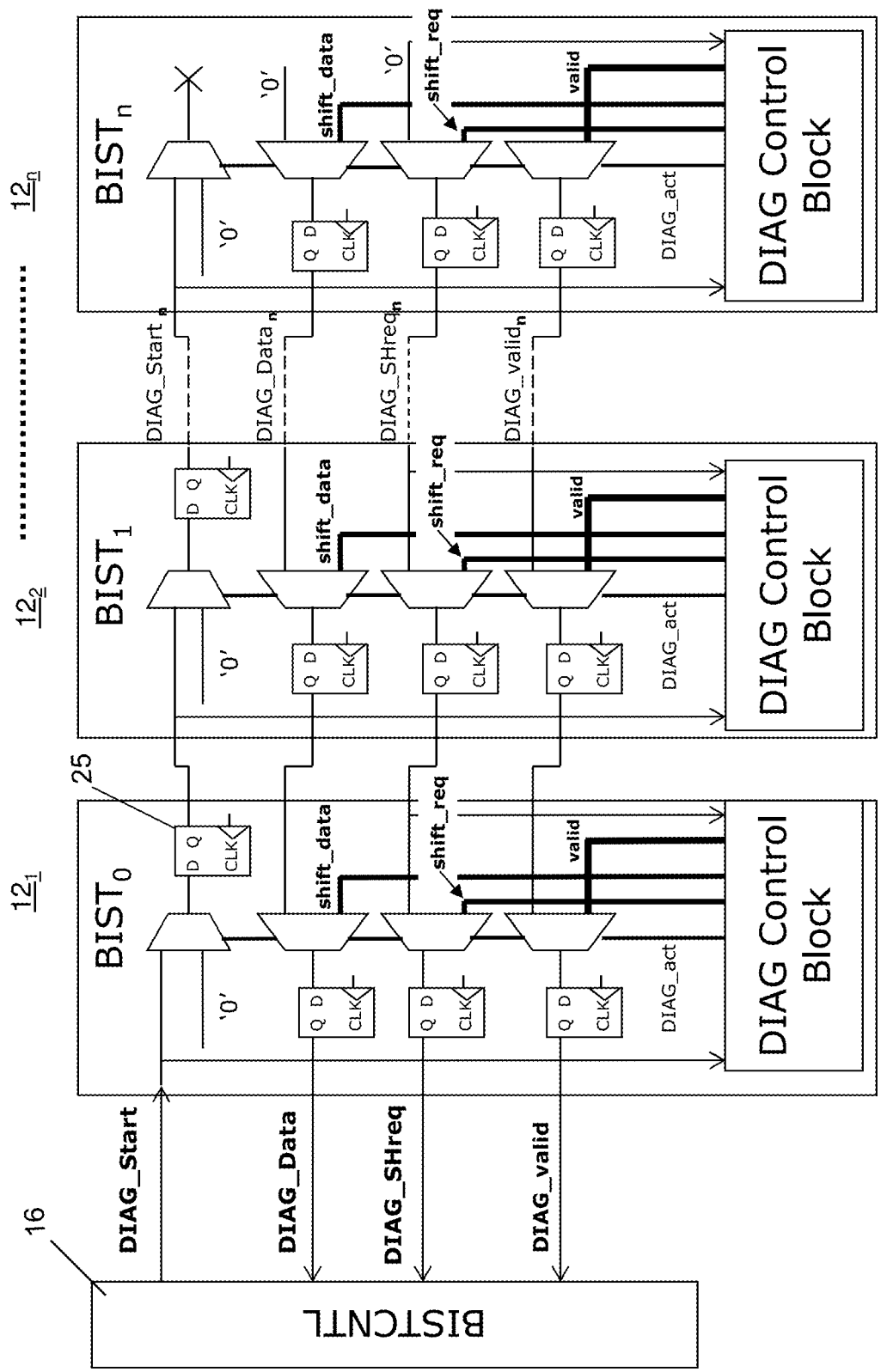
FIG. 4 shows an architecture/logic with alternative BIST engines in a long chain configuration, in accordance with aspects of the invention.

FIG. 4 shows an architecture/logic with alternative BIST engines in a chained configuration in accordance with aspects of the invention. In this embodiment, each of the BIST engines $12_1$, $12_2$ . . . $12_n$ includes a latch 25 (CLKCNTL). In addition, four pins are now provided, with a fourth signal, DIAG_valid. In this implementation, all signals of the DIAG bus are latched in the BIST engines $12_1$, $12_2$ . . . $12_n$, which are provided in a long chain. The BISTCNTL 16 will start accepting DIAG_data when DIAG_valid only goes high. This is needed since the BISTCNTL 16 may not be aware of which BIST engine is sending the data in a long chain, because it may be several cycles after DIAG_start is asserted and such signal is received at the BISTCNTL 16, depending on its position in the chain. Thus, when several hundred BIST engines are connected to the BISTCNTL 16, the DIAG bus outputs at each BIST engine can be latched and timing closure on long DIAG bus chains can be efficiently achieved.

Figure 5:
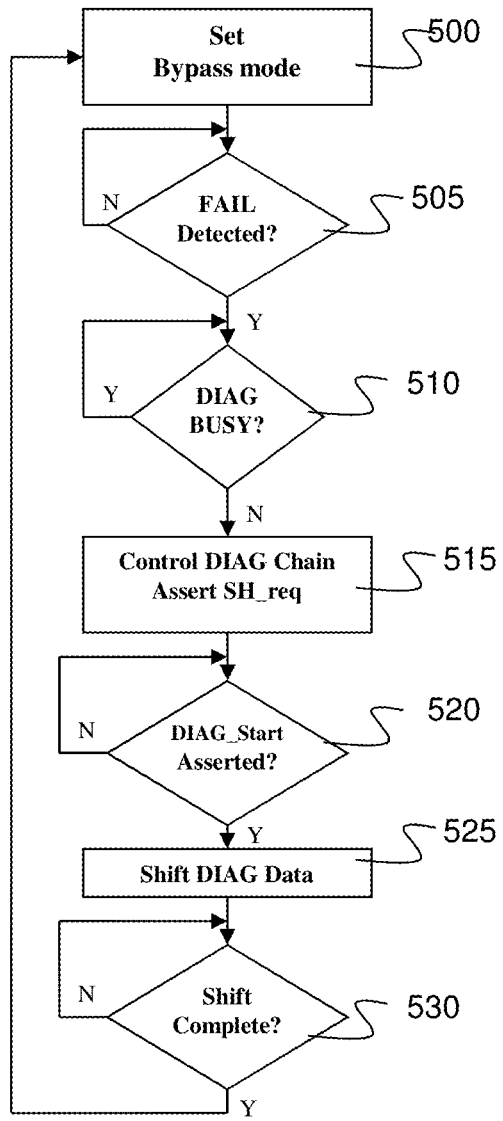
FIG. 5 shows a flow chart for implementing aspects of the invention.

FIG. 5 shows a flow chart for implementing aspects of the present invention. At step 500, the bypass mode is set, i.e., the MUXes of the BIST engines are put in bypass mode. BIST engines down the chain will drive the bus signal in this mode (DIAG_act de-asserted). At step 505, a determination is made as to whether a fail is detected and DIAG data becomes available. If not, then the process continues at this step until a fail is detected.

When a fail is detected, at step 510, a determination is made as to whether any downstream BIST engines are shifting DIAG data. DIAG_SHreq and DIAG_start should be de-asserted before a request can begin. If affirmative, the process will continue at this step. If no downstream BIST engines are shifting DIAG data, at step 515, a new request can be started. At this stage, the MUXes will come out of bypass mode (e.g., activating the BIST engine) and be controlled directly by the control block of the BIST engine (DIAG_act asserted).

At step 520, a determination is made as to whether BISTCNTL is ready to accept DIAG data. If not, the process continues at this step. If the BISTCNTL is ready to accept DIAG data, the process continues to step 525. At step 525, the DIAG_data will start shifting, while keeping DIAG_SHreq asserted. At step 530, a determination is made as to whether all of the shifts are completed, i.e., all the bits in the DIAG_data and de-assert DIAG_SHreq are completed. If so, then the process reverts back to step 500.

Figure 6:
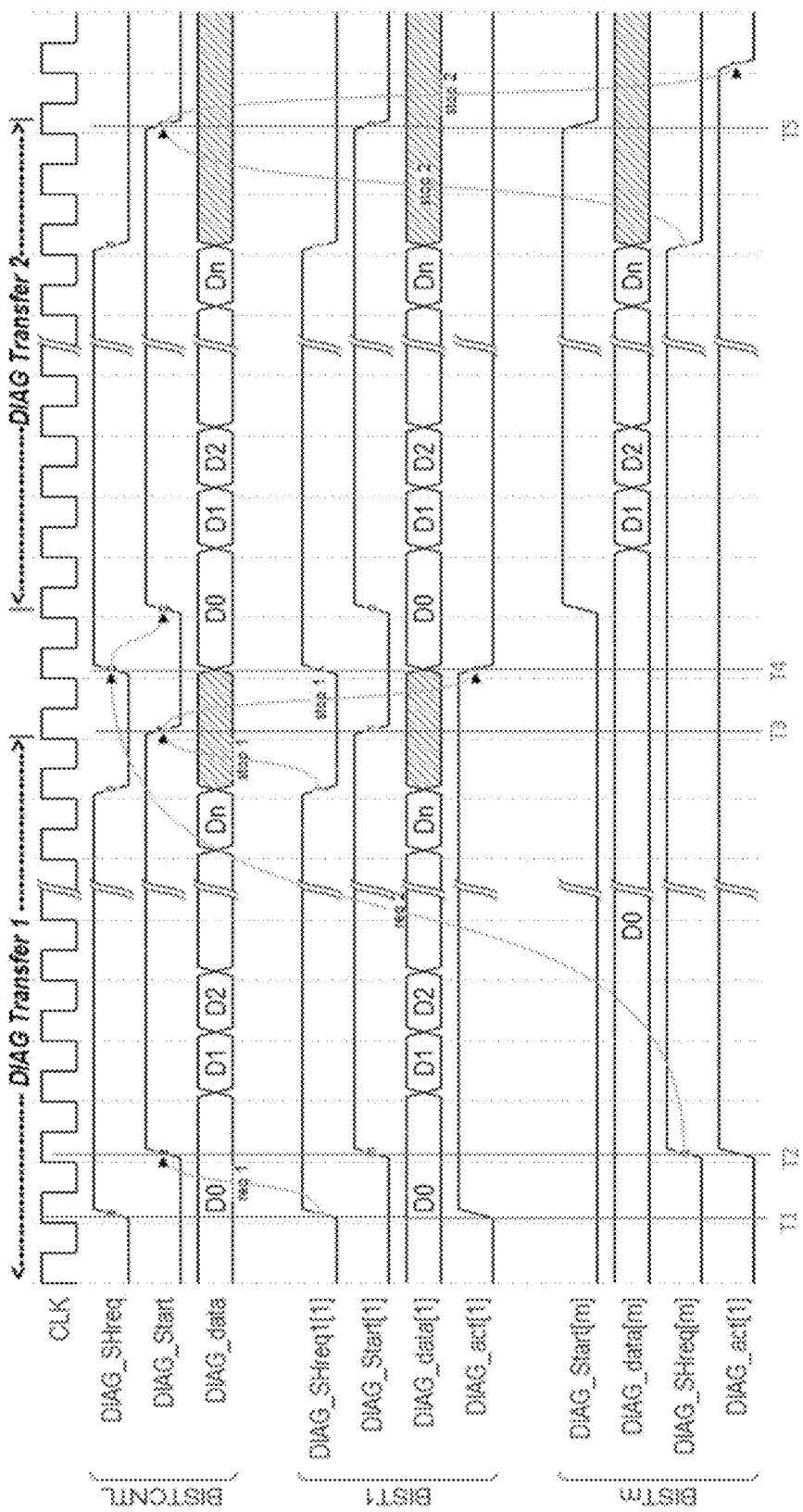
FIGS. 6 and 7 show exemplary timing scenarios in accordance with aspects of the invention.
Figure 7:
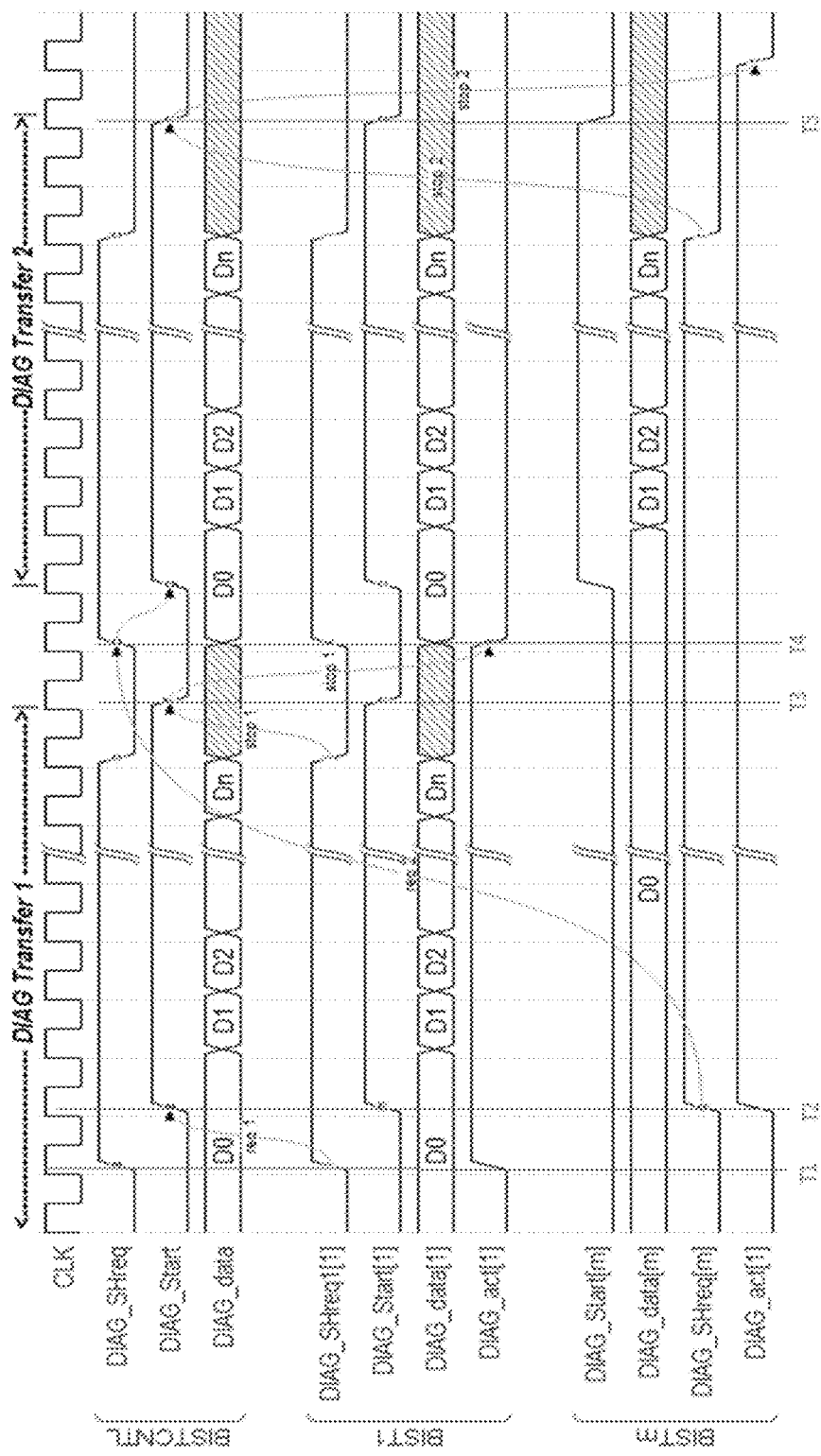

FIGS. 6 and 7 show exemplary timing scenarios in accordance with aspects of the present invention. In FIG. 6, using the embodiment shown in FIG. 2, the following example is provided.

At time T1—BIST1 Starts transfer when DIAG_start[1] is asserted.

At time T2—DIAG_SHreq[m] asserted while first transfer still in progress.

At time T3—DIAG_act[1] holds BISTm's request until transfer 1 is complete.

At time T4—DIAG_act[1] de-asserts one cycle after DIAG_start[1] is de-asserted.

This forwards BISTm request to BISTCNTL. BISTm starts DIAG transfer.

At time T5—BISTm transfer 2 completes and bus released in the end.

In FIG. 7, using the long chain embodiment shown in FIG. 4, the 2nd BIST instance in the chain performs a DIAG transfer. Hence all DIAG signals are delayed by 2 cycles as shown by the following example.

At time T1—BIST[2] Initiates DIAG transfer.

At time T2—BISTCNTL sees DIAG_SHreq.

At time T3—BISTCNTL grants shift request. DIAG_start asserted.

At time T4—DIAG_start seen by BIST engine.

At time T5—BIST engine asserts DIAG_valid and starts data shift.

At time T6—DIAG_valid seen by BISTCNTL, Starts capturing DIAG data.

At time T7—DIAG shift completed and DIAG_valid de-asserted by BIST.

At time T8—BISTCNTL stops DIAG data capture.

At time T9—DIAG_start de-asserted.

At time T10—BIST engine sees DIAG_start de-asserted.

At time T11—BIST engine de-asserts DIAG_act and releases DIAG bus.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   running a built-in-self-test (BIST) on a plurality of different memory types in parallel using a plurality of BIST engines set in a chained configured and configured to read from and write to specific types of the different memory types; and
   controlling, by arbitration logic, a selection of failing memories of the plurality of memories in a serial order in response to concurrent fails of multiple memories, wherein a tester is configured to collect failing memory data from concurrent failing memories consistent with a position of the failing memory and logic within the arbitration architecture.

2. The method of claim 1, wherein the arbitration logic automatically shifts the data of the failing memory from a dynamically selected failing memory based on position and time.

3. The method of claim 1, wherein the arbitration logic is triggered during a pause and provides arbitration among multiple failing memories.

4. The method of claim 1, wherein the arbitration logic dynamically selects a logic observation path from the failing memory to the chip pad amongst multiple failed memories.

5. The method of claim 1, further comprising continuing the BIST upon completion of collecting the failing memory data from the concurrent failing memories.

6. The method of claim 1, wherein failing memories detected by a closer BIST engine to a BIST controller will have higher priority in an arbitration scheme.

7. The method of claim 1, wherein:
   upon detection of the failing memory by a particular BIST engine of the plurality of BIST engines, a diagnosis control block checks if a diagnosis bus is busy;
   if not busy, the particular BIST engine will assert a diagnostic shift request signal to a BIST controller;
   the particular BIST engine will wait for a start signal from the BIST controller, at which time it will send diagnostic data of the failing memory to the BIST controller; and
   the diagnostic shift request signal is de-asserted at an end of shifting of the diagnostic data at which time the diagnosis bus is released for use by other BIST engines downstream of the plurality of BIST engines.

8. The method of claim 1, further comprising:
   pausing test operation for all memories upon detection of the failing memory;
   during the pause, the arbitration logic is triggered to dynamically select a logic observation path from the failing memory to the chip pad; and
   upon completion of collection of all failing memory data, the arbitration logic continues testing operation from the pause state, alleviating a need to start from a beginning.

9. The method of claim 1, wherein the data of the failing memory is accepted when a diagnose valid signal goes high.

10. The method of claim 1, wherein:
    the running the BIST on the plurality of different memory types in parallel is performed by the plurality of BIST engines; and
    the plurality of BIST engines are connected to a BIST controller in a daisy chain configuration and by a pin interface comprising:
      a first bus on which the BIST engines send a diagnosis shift request signal to the BIST controller;
      a second bus on which the BIST controller sends a diagnosis shift approval to the BIST engines; and
      a third bus on which the BIST engines send the diagnosis data of the failed memory to the BIST controller.

11. A method, comprising:
    detecting a failing memory from a selected BIST engine
    determining that no other BIST engines downstream from the selected BIST engine are shifting diagnosis data of another failing memory;
    shifting diagnosis data of the detected failing memory from the selected BIST engine; and
    preventing the other BIST engines from shifting failing data of the another failing memory during the shifting of the diagnosis data from the selected BIST engine, by the asserting of a diagnosis request signal.

12. The method of claim 11, further comprising de-asserting the diagnosis request signal when the shifting is completed.

13. The method of claim 11, further comprising setting a bypass mode of the plurality of BIST engine when all shifting is completed.

14. The method of claim 13, wherein the downstream BIST engines will drive a bus signal in the bypass mode.

15. The method of claim 14, wherein each of the BIST engines directly controls the bypass mode by an internal control block.

16. The method of claim 11, further comprising de-asserting a diagnosis shift request and start signal of another BIST engine, prior to sending a new request.

17. The method of claim 11, wherein the diagnosis shift request is buffered in the selected BIST engine.

18. The method of claim 11, wherein the diagnosis data of the failing memory is accepted when a diagnostic valid signal goes high.

19. An arbitration architecture, comprising:
    a BIST controller for receiving diagnosis data of a failed memory;
    a plurality of BIST engines that run in parallel and configured to read from and write to specific types of the different memory types, the plurality of BIST engines further connected to the BIST controller; and
    arbitration logic to serially order which of the plurality of BIST engines shifts diagnosis data of a failed memory to the BIST controller and to control a selection of failing memories in the serial order in response to concurrent fails of multiple memories, wherein a tester is configured to collect failing memory data from concurrent failing memories consistent with a position of the failing memory and the arbitration logic within the arbitration architecture.

20. The arbitration architecture of claim 19, wherein the plurality of BIST engines are connected to the BIST controller by an interface comprising:
    a first bus on which the BIST engines send a diagnosis shift request signal to the BIST controller;
    a second bus on which the BIST controller sends a diagnosis shift approval to the BIST engines; and
    a third bus on which the BIST engines send the diagnosis data of the failed memory to the BIST controller.

* * * * *